(12) United States Patent
Yoneya

(10) Patent No.: US 7,456,710 B2
(45) Date of Patent: Nov. 25, 2008

(54) SAW RESONATOR

(75) Inventor: Katsuro Yoneya, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 203 days.

(21) Appl. No.: 11/465,287

(22) Filed: Aug. 17, 2006

(65) Prior Publication Data

US 2007/0046399 A1    Mar. 1, 2007

(30) Foreign Application Priority Data

Aug. 25, 2005  (JP)  ............................. 2005-243631

(51) Int. Cl.
*H03H 9/00*  (2006.01)
(52) U.S. Cl. .................... 333/195; 333/193; 310/313 D; 310/313 B
(58) Field of Classification Search .................. 333/195, 333/193; 310/313 A, 313 B, 313 D
See application file for complete search history.

(56) References Cited

U.S. PATENT DOCUMENTS 5,793,266 A * 8/1998 Allen et al. .................. 333/193
7,230,501 B2 * 6/2007 Ogiso ..................... 331/107 A
7,321,279 B2 * 1/2008 Yoneya ........................ 333/195

FOREIGN PATENT DOCUMENTS

| JP | B2-2925158 | 5/1999 |
| JP | A-2004-040421 | 2/2004 |
| JP | A-2005-303357 | 10/2005 |

* cited by examiner

*Primary Examiner*—Anh Q Tran
(74) *Attorney, Agent, or Firm*—Oliff & Berridge, PLC

(57) ABSTRACT

A surface acoustic wave (SAW) resonator, including: a first interdigital transducer composed of a pair of interdigital electrodes provided in a propagation direction of a surface acoustic wave; a second interdigital transducer composed of a pair of interdigital electrodes provided in parallel to the first interdigital transducer; and a switch that alternately switches the pair of interdigital electrodes of the first interdigital transducer and the pair of interdigital electrodes of the second interdigital transducer; wherein $$7\lambda \leq B \leq 33\lambda$$

where $\lambda$ is a wavelength of a surface acoustic wave, and B is an addition of a width a1 of an engaged section of electrode fingers of the first interdigital transducer, a width a2 of an engaged section of electrode fingers of the second interdigital transducer, and a distance b between the engaged sections of both interdigital transducers.

3 Claims, 7 Drawing Sheets

SAW RESONATOR

BACKGROUND

1. Technical Field

The present invention relates to a surface acoustic wave (SAW) resonator and particularly to a SAW resonator suitable for apparatuses that perform communications by a frequency shift keying (FSK) system.

2. Related Art

Conventionally, as a digital signal communication system, an FSK communication system is known. The FSK system is, for example, a modulation system that discretely changes an instantaneous frequency of a carrier wave in response to a digital signal of 0 and 1 and is a communication system that is capable of modulating while keeping an amplitude change constant and is not much affected by the level fluctuation or noise. Further, the circuitry structure of the FSK system is simple, and its bandwidth during communication is wider than that in an amplitude shift keying (ASK) system or in a phase shift keying (PSK) system.

Therefore, the FSK communication system is highly usable, and various suggestions have been made on oscillators using this type of communication system. For example, oscillators proposed in Japanese Patent No. 2925158 and JP-A-2004-40421 also use the FSK communication system.

The oscillator disclosed in Japanese Patent No. 2925158 includes a plurality of SAW resonators having different resonant frequencies on a single piezoelectric substrate and oscillation circuits whose number corresponds to the number of the SAW resonators on a single semiconductor integrated circuit substrate, while the oscillation circuits are connected to a switching circuit.

The oscillator having such a structure operates the switching circuit in accordance with the frequency band to be used and selects an oscillation circuit coupled to the SLAW resonator in accordance with a, desired frequency band for oscillation.

Further, an oscillation circuit depicted in JP-A-2004-40421 is equipped with, in the circuit, two types of SAW filters having different frequency bands to be passed and a switching circuit on the output side of the SAW filters, and is composed of an amplifier and a feedback circuit having a fixed phase shifter.

With such an oscillator, only a required frequency of the frequency bands can be selected as the switching circuit switches the connected SAW filters.

The oscillator and oscillation circuit depicted in Japanese Patent No. 2925158 and JP-A-2004-40421 can provide the oscillator and oscillation circuit in accordance with a desired frequency band.

However, the oscillator and oscillation circuit depicted in Japanese Patent No. 2925158 and JP-A-2004-40421 are both equipped with a plurality of SAW resonators or SAW filters having different frequency bands and respond to the required frequency band by switching the SAW resonators or the SAW filters according to the frequency band to be used. Thus, when switching the SAW resonators or the SAW filters, errors such as instantaneous interruption of the resonant frequency and discontinuity of an output phase may occur due to such factors as electrical connection and phase difference between the SAW resonators or the SAW filters. Problems such as these are particularly influential in high-speed communications. Further, because the oscillation circuit depicted in Japanese Patent No. 2925158 includes the plurality of SAW resonators of different uses in a single circuit, it is not possible to obtain frequency accuracy and frequency deviation precision in every SAW resonator.

SUMMARY

An advantage of the invention is to provide a SAW resonator that is capable of excellently maintaining frequency accuracy and frequency deviation precision by eliminating the discontinuity of an output phase caused by switching between frequency bands even when the frequency band changes.

According to an aspect of the invention, a SAW resonator includes: a first interdigital transducer composed of a pair of interdigital electrodes provided in a propagation direction of a surface acoustic wave; a second interdigital transducer composed of a pair of interdigital electrodes provided in parallel to the first interdigital transducer; and a switch that alternately switches the pair of interdigital electrodes of the first interdigital transducer and the pair of interdigital electrodes of the second interdigital transducer; wherein $$7\lambda \leq B \leq 33\lambda$$

where $\lambda$ is a wavelength of a surface acoustic wave, and B is an addition of a width a1 of an engaged section of electrode fingers of the first interdigital transducer, a width a2 of an engaged section of electrode fingers of the second interdigital transducer, and a distance b between the engaged sections of both interdigital transducers.

With the SAW resonator having such characteristics, it is possible to impart a frequency difference to the output of the SAW resonator by continuously oscillating one of the two interdigital transducers (e.g., the first interdigital transducer) arranged on the piezoelectric substrate while conducting switching oscillation at the other interdigital transducer (e.g., the second interdigital transducer). Further, because the switching oscillation of the second interdigital transducer can be carried out with reference to the continuous oscillation of the first interdigital transducer, discontinuity of the output phase at the time of switching may not occur. Furthermore, because the two interdigital transducers are formed as one SAW element chip on the piezoelectric substrate, there may be no need to match the frequency accuracy and frequency deviation precision among the plurality of resonators as is in the conventional techniques, and, thus, adjustment of the frequency accuracy and frequency deviation precision may be simple. As a consequence, it becomes possible to maintain excellent frequency accuracy and frequency deviation precision. Further, by making the width of B to be $7\lambda \leq B \leq 33\lambda$, it is possible to set the frequency difference between the two frequencies caused by the switching oscillation to be 50 ppm-500 ppm, at which the FSK communication can be practically conducted within the frequency band of 300 MHz-500 MHz, which is the frequency band used in a short distance communication such as keyless entry of an automobile.

It is preferable that, with the SAW resonator having the structure as described above, the first and second interdigital transducers be provided in a manner that their interdigital electrodes are arranged line-symmetrically.

In this case, the phase difference between the waveform excited by the first interdigital transducer and the waveform excited by the second interdigital transducer becomes 0° or 180°, and, thus, the waveform (such as the output frequency) excited by the SAW resonator may easily be controlled.

Further, it is preferable that, with the SAW resonator having the structure as described above, the first and second interdigital transducers be provided in a manner that their identically configured interdigital electrodes are arranged in parallel.

In this case, also, the phase difference between the waveform excited by the first interdigital transducer and the waveform excited by the second interdigital transducer becomes 0° or 180°. Consequently, the waveform (such as the output frequency) excited by the SAW resonator having the structure as described above may also be easily controlled.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
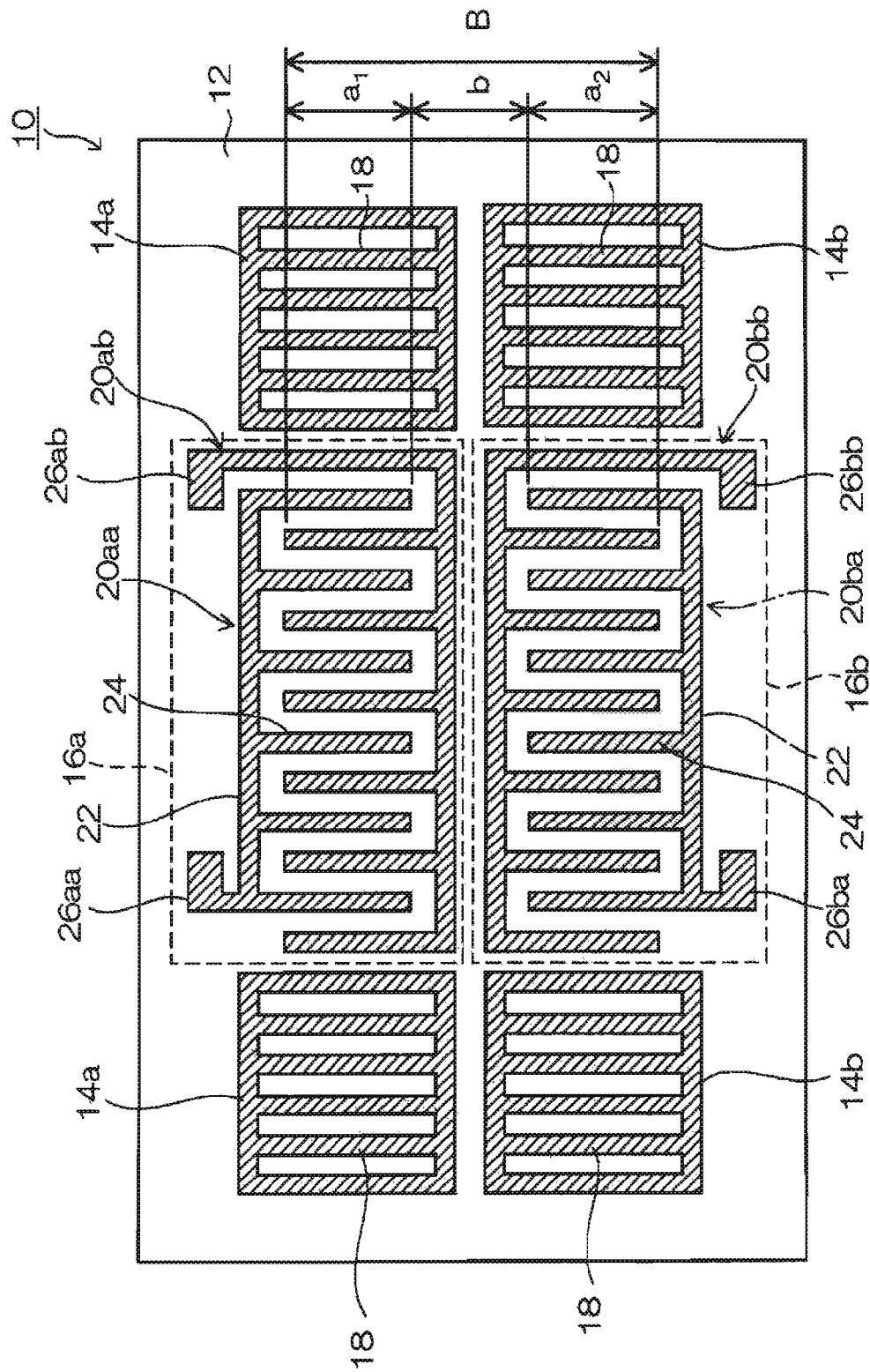
FIG. 1 is a diagram showing a working example of a SAW element chip used for a SAW resonator according to one embodiment of the invention.

Embodiments of the invention will now be described referring to the drawings. The following embodiments are some of the embodiments of the SAW resonator of the present invention, and the invention includes various embodiments insofar as the essential elements remain unchanged.

First, a SAW element chip used in the first embodiment of the SAW resonator of the invention will be described with reference to FIG. 1. A SAW element chip 10 used in this embodiment is composed basically of a piezoelectric substrate 12 and a conductive pattern formed on the piezoelectric substrate 12.

The piezoelectric substrate 12 may be composed of single crystal having piezoelectric properties, such as quartz, lithiumtantalate ($LiTaO_3$), lithiumtetraborate ($Li_2B_4O_7$), or litiumniobate ($LiNTbO_3$), or may be a sapphire substrate having a zinc oxide thin film.

The conductive pattern may be formed into a thin film by vapor-depositing or sputtering a conductive metal such as gold, copper, or aluminum on the piezoelectric substrate 12 and then by etching this film by a technique such as photolithography to form a pattern. The conductive pattern formed on the piezoelectric substrate 12 includes an interdigital transducer (IDT) 16a (16b) containing a pair of interdigital electrodes 20aa and 20ab (20ba and 20bb) and a reflector 14a (14b).

The interdigital electrodes 20 (20aa through 20bb) are composed of bus bars 22 arranged in a propagation direction of a surface acoustic wave on the piezoelectric substrate 12 and of a plurality of electrode fingers 24 arranged in a direction perpendicular to the bus bars, that is, in a direction perpendicular to the propagation direction of the surface acoustic wave. The IDT 16 (16a, 16b) is configured by combining a pair of interdigital electrodes 20 in such a manner that the electrode fingers 24 are alternately engaged with one another. Also, using the center of the piezoelectric substrate 12 as a base point, for example, the SAW element chip 10 used in this embodiment is equipped with two (a pair of) IDTs 16 arranged closely and line-symmetrically on a single piezoelectric substrate 12 in a manner that the bus bars 22 of the interdigital electrodes 20 lie in parallel. With this structure, the phase difference between the waveforms excited by the two IDTs 16 becomes 0° or 180°, and, thus, the output frequency can be easily adjusted by the SAW resonator. As for the reflectors 14 in the SAW element chip 10 used in the embodiment, the reflectors 14a and 14b are separately arranged, sandwiching the two IDTs 16a and 16b, respectively. The reflectors 14 (14a and 14b) are formed in a grating, joining end portions of a plurality of conductor strips 18 arranged in parallel to the electrode fingers 24 of the interdigital electrodes 20. Additionally, on each of the interdigital electrodes 20 constituting the IDTs 16, electrode pads 26 are formed so as to couple lines for inputting and outputting power (signals). Further, there is an insulation section between the two line-symmetrically arranged IDTs 16a and 16b in the propagation direction of the surface acoustic wave.

Figure 2:
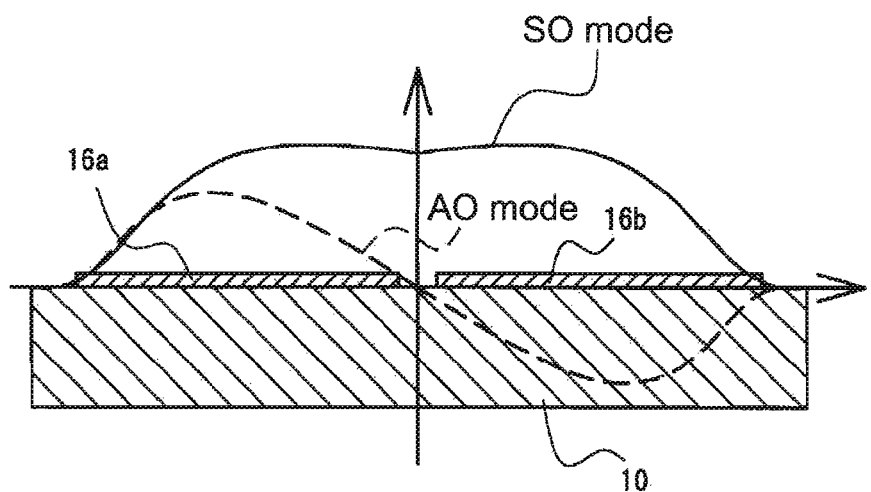
FIG. 2 is a diagram showing oscillation modes by the SAW resonator.

With the SAW element chip 10 having the above-described structure, it is possible to excite waveforms of two different modes when matching and reversing the signal inputted/outputted to the interdigital electrodes 20aa and 20ab constituting the IDT 16a and the signal inputted/outputted to the interdigital electrodes 20ba and 20bb. For example, the SAW element chip 10 used in the embodiment is capable of exciting waveforms of an SO mode and an AO mode as shown in FIG. 2. This is because the output signal when the SAW element chip 10 having the described structure is used as the resonator becomes a synthesized wave of the surface acoustic wave excited by the two IDTs 16a and 16b. In other words, when the signals inputted/outputted to each of the closely and line-symmetrically arranged IDTs 16 are matched, the oscillation waveforms excited by the adjacent IDTs 16a and 16b become identical, like the SO mode shown in FIG. 2. On the contrary, when the signals inputted/outputted to each of the IDTs 16 are reversed, the excited oscillation waveforms are reversed and out of phase by 180°, that is, the waveform like the AO mode shown in FIG. 2 is excited. Thus, when the SAW element chip 10 is used as the resonator, it becomes possible to compose the SAW resonator capable of outputting the signal of two different frequency bands by a single SAW element chip 10, by switching the inputting/outputting of the signal to the two IDTs 16a and 16b.

In addition, when switching the inputting/outputting of the signal, it only needs to switch the inputting/outputting at either one of the two IDTs 16, the other IDT 16 continues to oscillate even at the time of switching. In other words, the SAW element chip 10 that carries out the switching of the frequency bands contains a reference oscillation section therein. Therefore, even when switching of the signal input/output at the other IDT 16 is conducted while the one IDT 16 performs the continuous oscillation, it is possible to immediately determine the phase of the output signal with reference to the oscillation waveform of the one IDT 16. As a consequence, there occurs no instantaneous oscillation interruption caused by switching of the frequency bands, nor phase discontinuity of the output signal.

Further, because the SAW resonator of the embodiment using the SAW element chip 10 having the above-described configuration carries out the oscillation at the oscillation section structured as a single element chip, it is not necessary, as is conventionally, to oscillate after tuning the frequency accuracy and the frequency deviation precision between two SAW resonators. Thus, it becomes easy to adjust the frequency accuracy and the frequency deviation precision and to excellently maintain both frequency accuracy and frequency deviation precision.

The SO mode and AO mode shown in FIG. 2 are the waveforms showing the modes oscillated by the SAW resonator of the embodiment. The SO mode shown in FIG. 2 is a line-symmetrical mode used as the basic mode and is the oscillation mode when the signals inputted/outputted to the IDTs 16a and 16b are matched. Further, the AO mode shown in FIG. 2 is a point-symmetrical mode used as a high-order mode and is the oscillation mode when the signals inputted/outputted to the IDTs 16a and 16b are reversed.

The purpose of the SAW resonator of the embodiment is to apply to the short-distance communication using very weak radio waves used for a system such as the keyless entry of an automobile, and, therefore, the frequency band to be used is considered as 300 MHz-500 MHz. A practical frequency difference that allows the FSK communication in the frequency band of 300 MHz-500 MHz is about 50 ppm-500 ppm. Accordingly, the SAW resonator of the embodiment is such that the frequency difference between the SO mode and the AO mode can be set at 50 ppm-500 ppm.

With the SAW element chip 10 having the above-mentioned structure, there are roughly two conditions for determining the frequency difference when the SAW element chip 10 is used as the resonator. One is the relation between the film thickness of the conductive pattern and the line width of the electrode fingers 24 that compose the IDTs 16, and the other is a width B, which is an addition of an addition of widths $a_1$ and $a_2$ of the engaged sections of the electrode fingers 24 (widths of engaged fingers) in the two IDTs 16a and 16b and a width b between the engaged sections. The former relation means that the frequency difference of the SAW resonator when the film of the conductive pattern is thick and the line width of the electrode finger 24 is wide differs from the frequency difference when the film of the conductive pattern is thin and the line width the electrode finger 24 is narrow, even under a condition that the width of B is the same. The latter relation describing the width of B means that, even when the film thicknesses of the conductive pattern and the line widths of the electrode fingers 24 differ, it is possible to adjust the frequency difference of the SAW resonator by adjusting the width of B.

Figure 3:
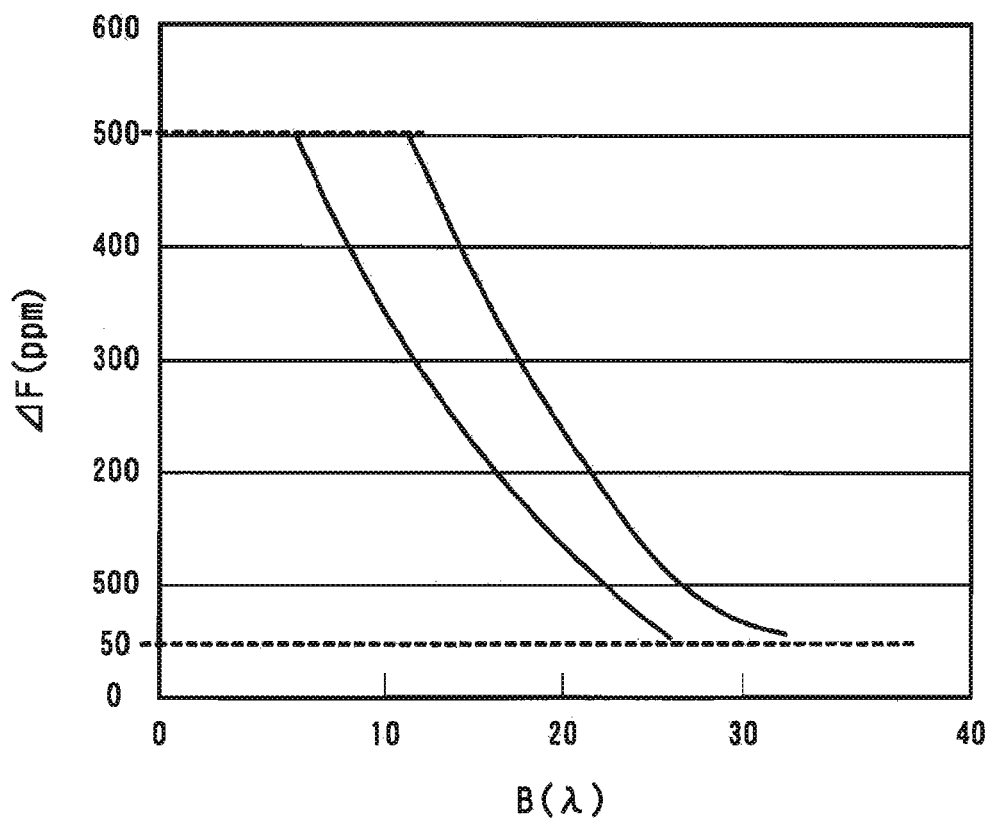
FIG. 3 is a graph showing a relation of a width of B to a frequency difference between two frequencies.

After a series of studies on the relations between the width of B and the frequency difference and between the film thickness of the electrode finger 24 and the line width, the applicant of the present invention has come up with the results as shown in FIG. 3. More specifically, the results indicate that, when the film of the conductive pattern is made thick and the line width the electrode finger is made wide, the SAW element chip 10 having the described structure performs well if the width of B is set between about 7 λ and about 27 λ in order to have the frequency difference (ΔF) between the SO mode and the AO mode to be 50 ppm-500 ppm. Further, the results indicate that, when the film of the conductive pattern is made thin and the line width the electrode finger is made narrow, the SAW element chip 10 performs well if the width of B is set between about 13 λ and about 33 λ in order to have the frequency difference between the SO mode and the AO mode to be 50 ppm-500 ppm. In short, it can be generally said that, with the SAW element chip 10 of the embodiment. The frequency difference of 50 ppm-500 ppm can be realized within the frequency band to be used by setting the width of B to be between about 7 λ and about 33 λ. Also, it can be said that, within the described range, the narrower the width of B is, the greater the frequency difference between the two modes can be set. Note that λ is the length of one wavelength of the excited surface acoustic wave. Further, the width b between the electrode fingers of the two IDTs 16a and 16b is preferably 10 percent of the width of B at the maximum, that is about 2 λ to 3 λ, in order to maintain the coupling condition of the surface acoustic wave excited by the two IDTs 16a and 16b.

Figure 4:
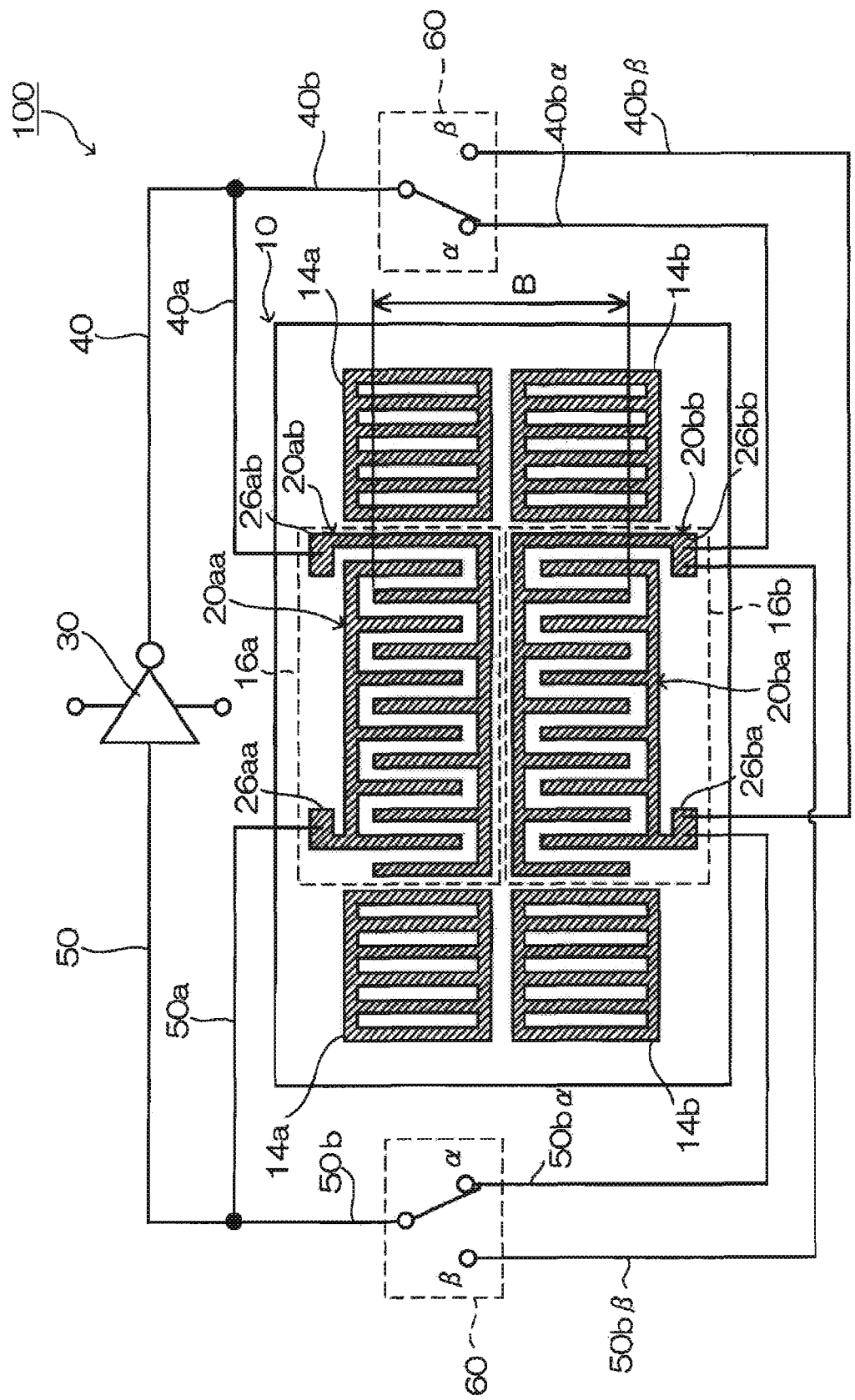
FIG. 4 is a diagram showing a first embodiment of the SAW resonator capable of switching oscillation.

FIG. 4 shows the outline structure of the SAW resonator having the circuit that performs the SO mode and AO mode oscillations by using the SAW element chip 10 of the above-described configuration. That is, a SAW resonator 100 of this embodiment is basically composed of an inverter 30 coupled to a power source and various types of paths that electrically couple the inverter 30 with the SAW element chip 10.

The paths composing the SAW resonator 100 of the embodiment include a signal input path 40 that inputs signals outputted from the inverter 30 into the IDTs 16 and a signal output path 50 that inputs signals outputted from the IDTs 16 into the inverter 30. The signal input path 40 and the signal output path 50 are both coupled to branched paths, the branched paths being a first signal input path 40a, a second signal input path 40b, a first signal output path 50a, and a second signal output path 50b.

In this embodiment, the first signal input path 40a and the first signal output path 50a are coupled to the IDT 16a, and the second signal input path 40b and the second signal output path 50b are coupled to the IDT 16b. More specifically, the first signal input path 40a is coupled to an electrode pad 26ab provided on the interdigital electrode 20ab, and the first signal output path 50a is coupled to an electrode pad 26aa provided on the interdigital electrode 20aa. The second signal input path 40b and the second signal output path 50b are branched into two paths through respective switches 60 so as to reverse the input/output signals. Of the branched paths, the paths coupled to coupling points a of the switches 60 are a basic mode signal input path 40bα and a basic mode signal output path 50bα, and the paths coupled to coupling points β of the switches 60 are a high-order mode signal input path 40bβ and a high-order mode signal output path 50bβ. Of these branched paths, the basic mode signal input path 40bα is coupled to an electrode pad 26bb provided on the interdigital electrode 20bb, and the basic mode signal output path 50bα is coupled to an electrode pad 26ba provided on the interdigital electrode 20ba. Also, the high-order mode signal input path 40bβ is coupled to the electrode pad 26ba provided on the interdigital electrode 20ba, and the high-order mode signal output path 50bβ is coupled to the electrode pad 26bb provided on the interdigital electrode 20bb.

By using the switches 60 to switch the coupling positions to the coupling points α or to the coupling points β, coupling destinations of the second signal input path 40b and the second signal output path 50b can be switched to the basic mode signal input path 40bα and the basic mode signal output path 50bα, or switched to the high-order mode signal input path 40bβ and the high-order mode signal output path 50bβ. Additionally, it is desirable that the switch 60 provided on the signal input side and the switch 60 provided on the signal output side synchronously perform the switching of the coupling points.

On the SAW element chip 10 coupled to such a circuit, because the interdigital electrodes 20 on the input/output sides of the IDT 16a and the IDT 16b are positioned line-symmetrically, the surface acoustic wave excited by the IDT 16a and the surface acoustic wave excited by the IDT 16b become the same phase when the switches 60 select the coupling points α. Therefore, the waveform of the excited surface acoustic wave by the SAW resonator 100 becomes the basic mode expressed as the SO mode shown in FIG. 2.

In contrast, when the switches 60 select the coupling points β, the interdigital electrodes (20*ba* and 20*bb*) on the input/output sides of the IDT 16*b* are reversed with respect to the interdigital electrodes 20 (20*aa* and 20*ab*) on the input/output sides of the IDT 16*a*. In this case, the surface acoustic wave excited by the IDT 16*a* and the surface acoustic wave excited by the IDT 16*b* become a reverse phase, and the phase of the surface acoustic wave becomes out of phase by 180°. Thus, the waveform of the excited surface acoustic wave by the SAW resonator 100 becomes the high-order mode expressed as the AO mode shown in FIG. 2.

Figure 5:
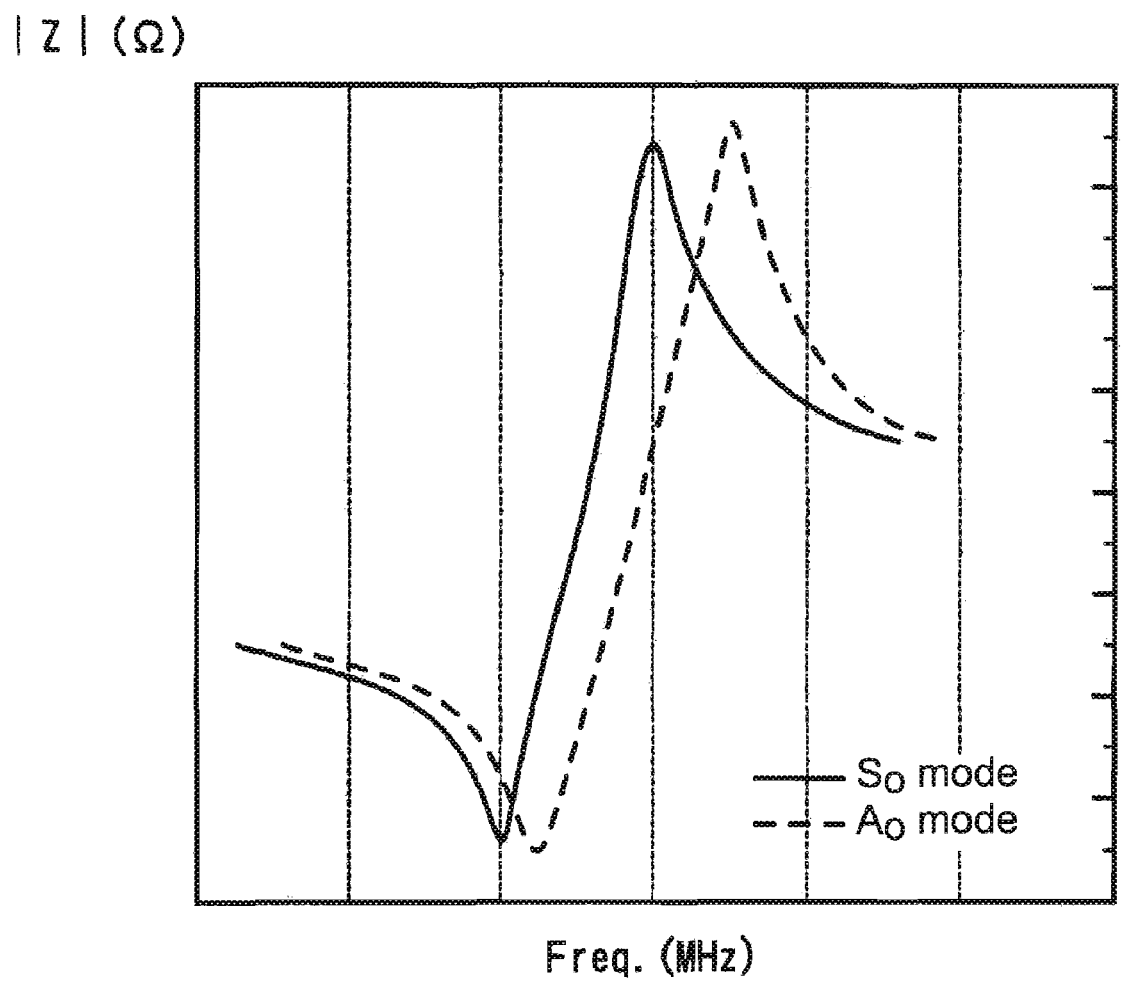
FIG. 5 is a graph showing frequency deviations caused by switching oscillation modes.

FIG. 5 shows impedance characteristics of the SAW resonator 100 of the embodiment that is capable of switching the oscillation modes and outputting the signal as stated above. FIG. 5 indicates that both the resonant frequency when the impedance becomes minimum and an anti-resonant frequency when the impedance becomes maximum shift when the oscillation modes switch.

Figure 6:
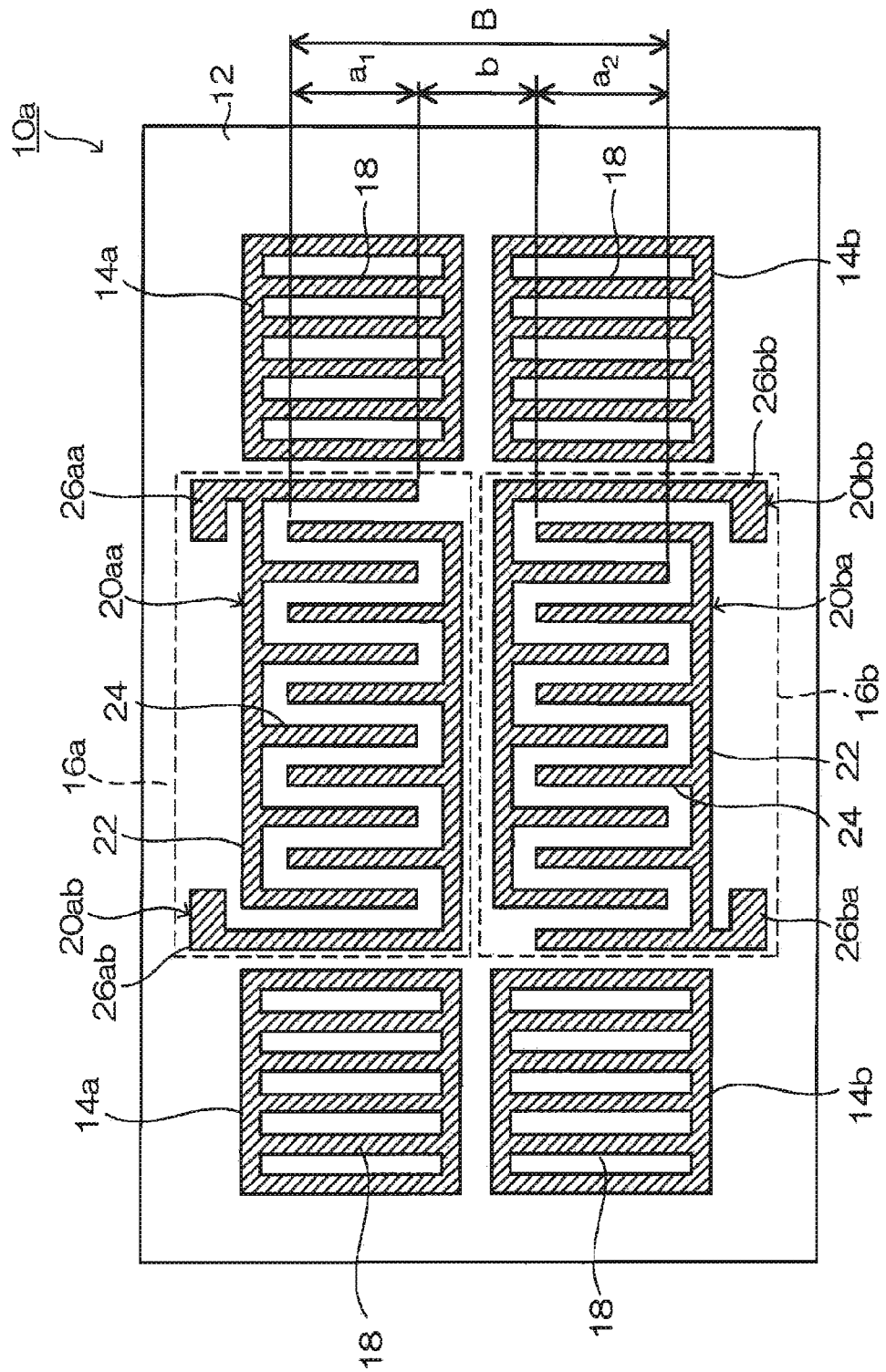
FIG. 6 is a diagram showing a working example of the SAW element chip used in the SAW resonator according to one embodiment of the invention.

The second embodiment of the SAW resonator of the invention will now be described with reference to FIGS. 6 and 7. Similarly to the SAW element chip 10 described in the first embodiment, a SAW element chip 10*a* used in a SAW resonator 100*a* of the present embodiment is also composed basically of the piezoelectric substrate 12 and the conductive pattern arranged on the piezoelectric substrate 12. Also, similarly to the SAW element chip 10 described in the first embodiment, this conductive pattern also includes the two IDTs 16*a* and 16*b* and the reflectors 14*a* and 14*b* sandwiching the two IDTs 16 (16*a* and 16*b*), respectively. Accordingly, these compositions will not be described in detail, and only differences from the SAW element chip 10 of the first embodiment will be described below.

The SAW element chip 10*a* of the embodiment differs from the SAW element chip 10 of the first embodiment in the arrangement of the two IDTs 16*a* and 16*b* arranged on the piezoelectric substrate 12. That is, with the SAW element chip 10*a* of this embodiment, the two IDTs 16 having the same configuration are serially and closely arranged in a manner that their bus bars 22 lie in parallel as shown in FIG. 6. Further, although the electrode pads 26 (26*aa* through 26*bb*) are formed point-symmetrically to the IDTs in FIG. 6, this does not influence the properties of the IDTs 16.

The SAW element chip 10*a* having such a structure is also capable of exciting the waveforms of two different modes as the resonator, between matching and reversing the signal inputted/outputted to the interdigital electrodes 20*aa* and 20*ab* that constitute the IDT 16*a* and the signal inputted/outputted to the interdigital electrodes 20*bb* and 20*ba* that constitute the IDT 16*a*. That is, the waveforms of the SO mode and the AO mode as shown in FIG. 9 can be excited. This is because, similarly to the SAW element chip 10 in the first embodiment, the signal outputted from the SAW element chip 10*a* becomes the synthesized wave of the surface acoustic wave excited by the two IDTs 16*a* and 16*b*. In other words, when the signals inputted/outputted to the closely and serially arranged IDTs 16*a* and 16*b* are matched, the oscillation waveforms excited by the IDTs 16 lying next to each other become identical, like the SO mode shown in FIG. 2. On the contrary, when the signals inputted/outputted to each of the IDTs 16*a* and 16*b* are reversed, the excited oscillation waveforms are reversed and out of phase by 180°, that is, the waveform like the AO mode shown in FIG. 2 is excited. Consequently, the SAW element chip 10*a* of this embodiment is capable of outputting the signals of two different frequency bands by switching the signal input/output to the two IDTs 16, even though it is a single SAW resonator.

Figure 7:
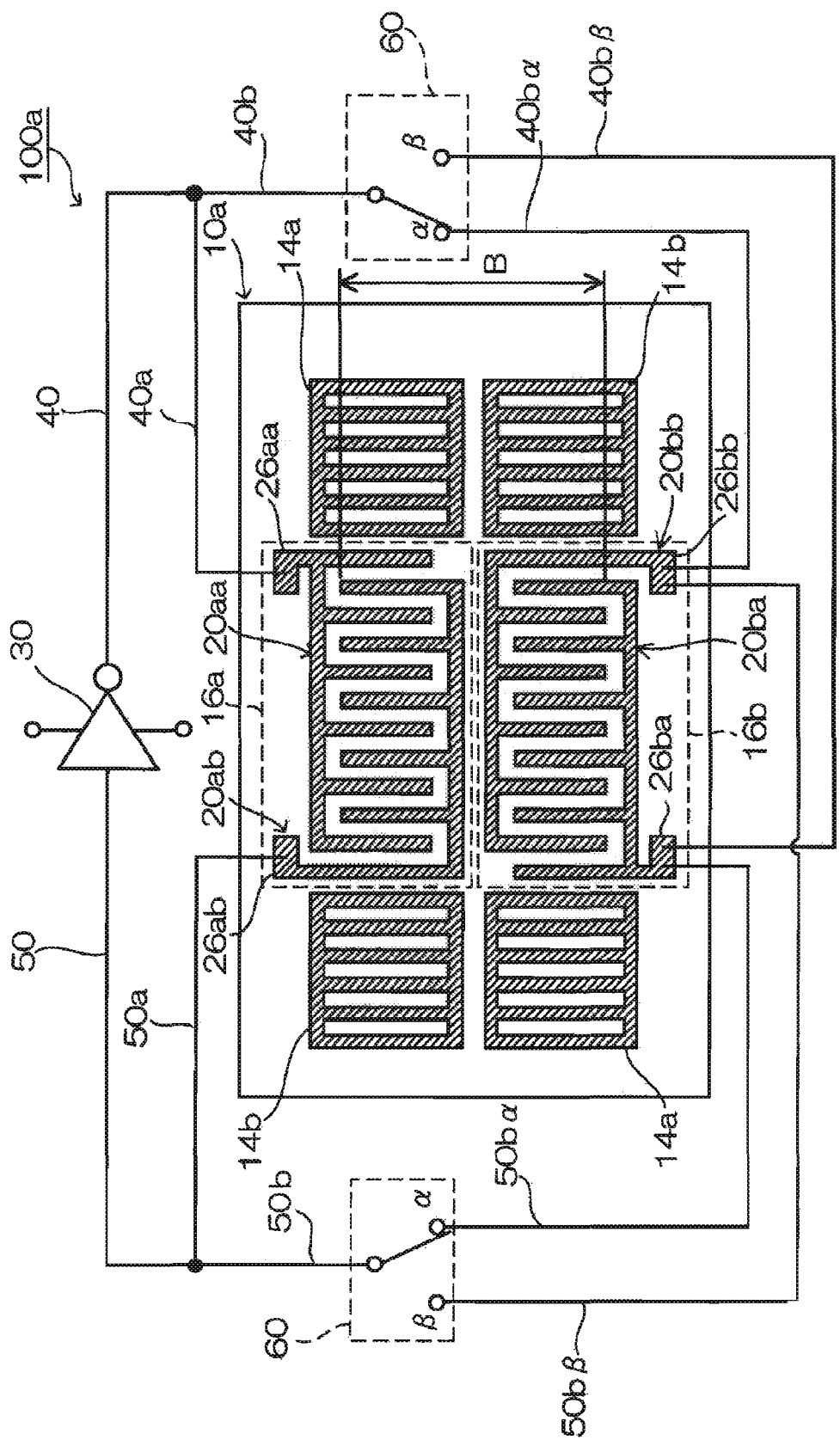
FIG. 7 is a diagram showing a second embodiment of the SAW resonator capable of switching oscillation.

FIG. 7 shows the outline configuration of the circuit as the SAW resonator using the SAW element chip structured as described above that performs the SO and AO mode oscillations. The SAW, resonator of this embodiment is the same as the circuit shown in the first embodiment and basically includes the inverter 30 and various types of paths to electrically couple this inverter 30 with the SAW resonator 10*a*.

The paths composing the SAW resonator 100 of the embodiment include a signal input path 40 that inputs the signals outputted from the inverter 30 into the IDTs 16 and a signal output path 50 that inputs the signals outputted from the IDTs 16 into the inverter 30. The signal input path 40 and the signal input path 50 are both coupled to the branched paths, the branched paths being a first signal input path 40*a*, a second signal input path 40*b*, a first signal output path 50*a*, and a second signal output path 50*b*.

In this embodiment, the first signal input path 40*a* and the first signal output path 50*a* are coupled to the IDT 16*a*, and the second signal input path 40*b* and the second signal output path 50*b* are coupled to the IDT 16*b*. More specifically, the first signal input path 40*a* is coupled to the electrode pad 26*aa* provided on the interdigital electrode 20*aa*, and the first signal output path 50*a* is coupled to the electrode pad 26*ab* provided on the interdigital electrode 20*ab*. The second signal input path 40*b* and the second signal output path 50*b* are branched into two paths via respective switches 60 so as to reverse the input/output signals. Of the branched paths, the paths coupled to coupling points α of the switches 60 are a basic mode signal input path 40*b*α and a basic mode signal output path 50*b*α, and the paths coupled to coupling points β of the switches 60 are a high-order mode signal input path 40*b*β and a high-order mode signal output path 50*b*β. Of these branched paths, the basic mode signal input path 40*b*α is coupled to the electrode pad 26*bb* provided on the interdigital electrode 20*bb*, and the basic mode signal output path 50*b*α is coupled to the electrode pad 26*ba* provided on the interdigital electrode 20*ba*. Also, the high-order mode signal input path 40*b*β is coupled to the electrode pad 26*ba* provided on the interdigital electrode 20*ba*, and the high-order mode signal output path 50*b*β is coupled to the electrode pad 26*bb* provided on the interdigital electrode 20*bb*.

By using the switches 60 to switch the coupling positions to the coupling points α or to the coupling points β, the coupling destinations of the second signal input path 40*b* and the second signal output path 50*b* can be switched to the basic mode signal input path 40*b*α and the basic mode signal output path 50*b*α, or switched to the high-order mode signal input path 40*b*β and the high-order mode signal output path 50*b*β. Additionally, it is desirable that the switch 60 provided on the signal input side and the switch 60 provided on the signal output side synchronously perform the switching of the coupling points.

Other conditions and effects are the same as those with the SAW resonator 100 of the first embodiment.

Figure 8:
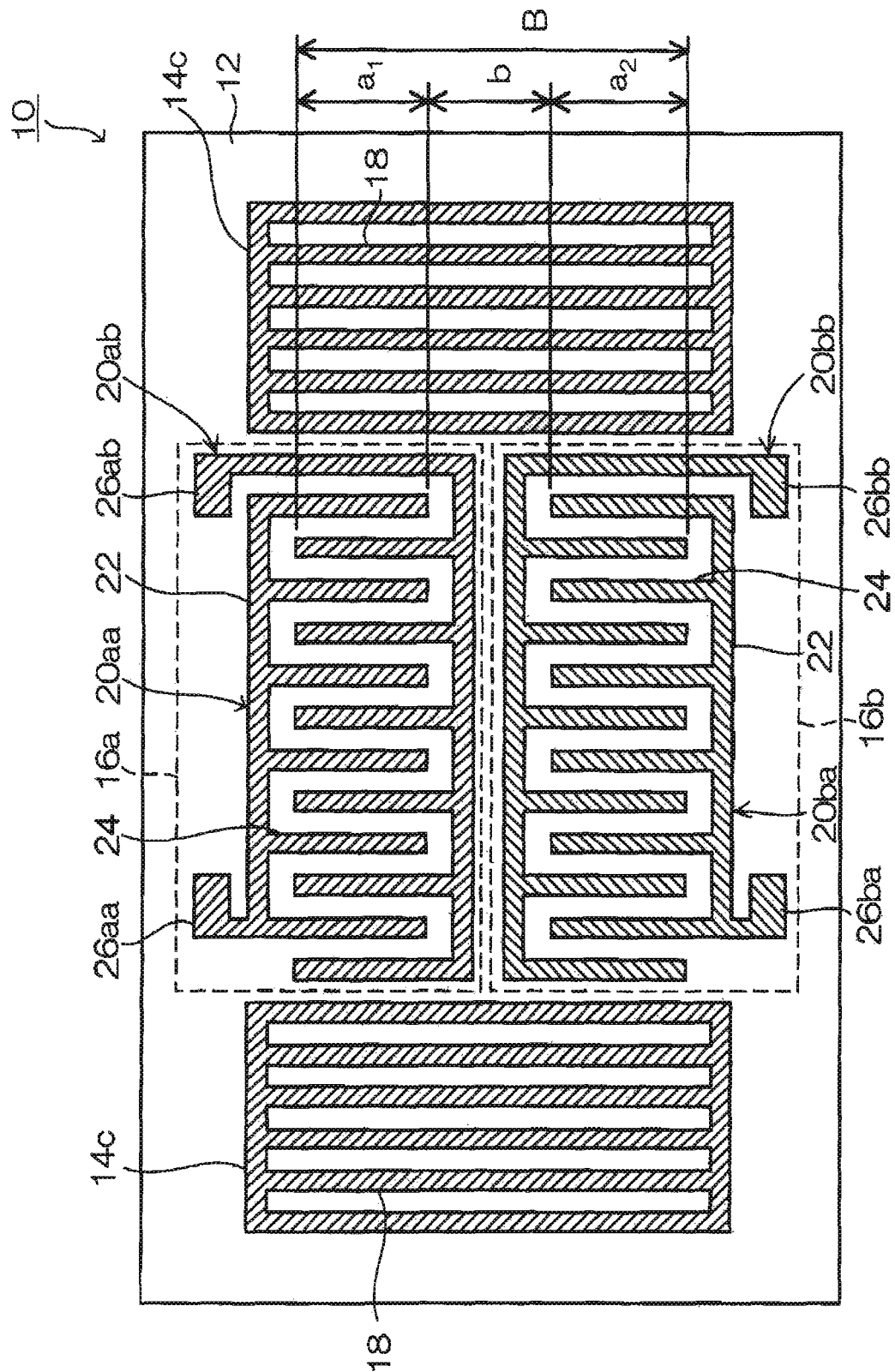
FIG. 8 is an example of the SAW element chip employing large reflectors.

In addition, although each of the drawings showing the outline structures of the embodiments illustrates that the bus bars 22 constituting the interdigital electrodes have the same width on the input side and the output side, the bus bars 22 may have different widths. Further, in the embodiments, although it is described that there are separate reflectors 14*a* and 14*b* for the two IDTs 16*a* and 16*b*, the reflectors may be large-sized (reflectors 14*c*) in that they together sandwich the two IDTs 16*a* and 16*b* as shown in FIG. 8.

The entire disclosure of Japanese Patent Application No. 2005-243631, filed August 25 is expressly incorporated by reference herein.

What is claimed is:

1. A surface acoustic wave (SAW) resonator, comprising:
   a first interdigital transducer composed of a pair of interdigital electrodes provided in a propagation direction of a surface acoustic wave;
   a second interdigital transducer composed of a pair of interdigital electrodes provided in parallel to the first interdigital transducer; and
   a switch that alternately switches the pair of interdigital electrodes of the first interdigital transducer and the pair of interdigital electrodes of the second interdigital transducer; wherein $7\lambda \leq B \leq 33\lambda$ where $\lambda$ is a wavelength of a surface acoustic wave, and B is an addition of a width a1 of an engaged section of electrode fingers of the first interdigital transducer, a width a2 of an engaged section of electrode fingers of the second interdigital transducer and a distance b between the engaged sections of both interdigital transducers.

2. The SAW resonator according to claim 1, wherein the first and second interdigital transducers are provided in a manner that their interdigital electrodes are arranged line-symmetrically.

3. The SAW resonator according to claim 1, wherein the first and second interdigital transducers are provided in a manner that their identically configured interdigital electrodes are arranged in parallel.

* * * * *